United States Patent [19]

Hollerbauer

[11] Patent Number: 5,283,885
[45] Date of Patent: Feb. 1, 1994

[54] STORAGE MODULE INCLUDING A REFRESH DEVICE FOR STORING START AND STOP REFRESH ADDRESSES

[76] Inventor: Werner Hollerbauer, Dobrastrasse 24, A-2344 Maria Enzersdorf, Austria

[21] Appl. No.: 945,424

[22] Filed: Sep. 14, 1992

Related U.S. Application Data

[63] Continuation of Ser. No. 337,022, Apr. 12, 1989, abandoned.

[30] Foreign Application Priority Data

Sep. 9, 1988 [AT] Austria ................................. 2217/88

[51] Int. Cl.⁵ .................... G06F 12/06; G11C 11/406
[52] U.S. Cl. ................................. 395/425; 365/222; 365/52; 365/45; 365/189.07; 395/400; 364/DIG. 1; 364/246.91; 364/964.9
[58] Field of Search ............................. 395/400, 425; 364/200 MS File, 900 Ms File; 365/22, 52, 189.07, 45

[56] References Cited

U.S. PATENT DOCUMENTS

| | | | |
|---|---|---|---|
| 4,368,466 | 1/1983 | Dwire | 340/799 |
| 4,701,843 | 10/1987 | Cohen | 395/425 |
| 4,802,118 | 1/1989 | Honda et al. | 395/425 |
| 4,823,302 | 4/1989 | Christopher | 395/425 |
| 5,021,951 | 6/1991 | Baba | 395/800 |

FOREIGN PATENT DOCUMENTS

| | | |
|---|---|---|
| 0231090 | 8/1987 | European Pat. Off. |
| 59-140591 | 8/1984 | Japan . |
| 63-013197 | 1/1988 | Japan . |

*Primary Examiner*—Glenn Gossage
*Attorney, Agent, or Firm*—Steven R. Biren

[57] ABSTRACT

A storage module which can be inserted into a data processing apparatus, such as a dictating apparatus, includes an at least partly random accessible storage device (5) for the storage of digital data signals and an access device for serially accessing storage locations in the storage device. The storage device requires refreshing and cooperates with a refresh device (6) for refreshing data signals stored in the storage device (5). The refresh device (6) includes additional storage devices (11) which store, upon writing in the storage locations of the storage device (5), start addresses and stop addresses from the access device (9), under the control of a control circuit (12). Only storage locations which are situated between a pair of start and stop addresses are timely refreshed via a refresh control device (20). Such a storage module is preferably used in conjunction with the dictating apparatus for the storage of speech signals.

8 Claims, 4 Drawing Sheets

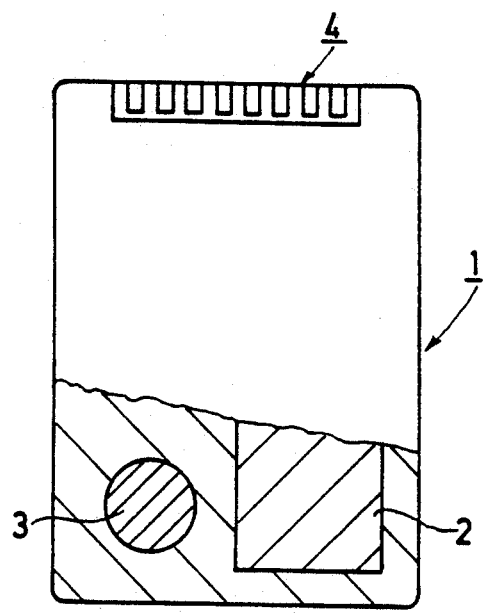
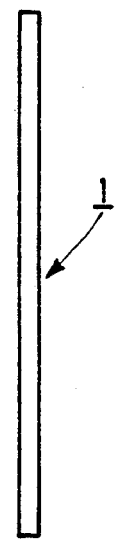
Fig.1  Fig.2
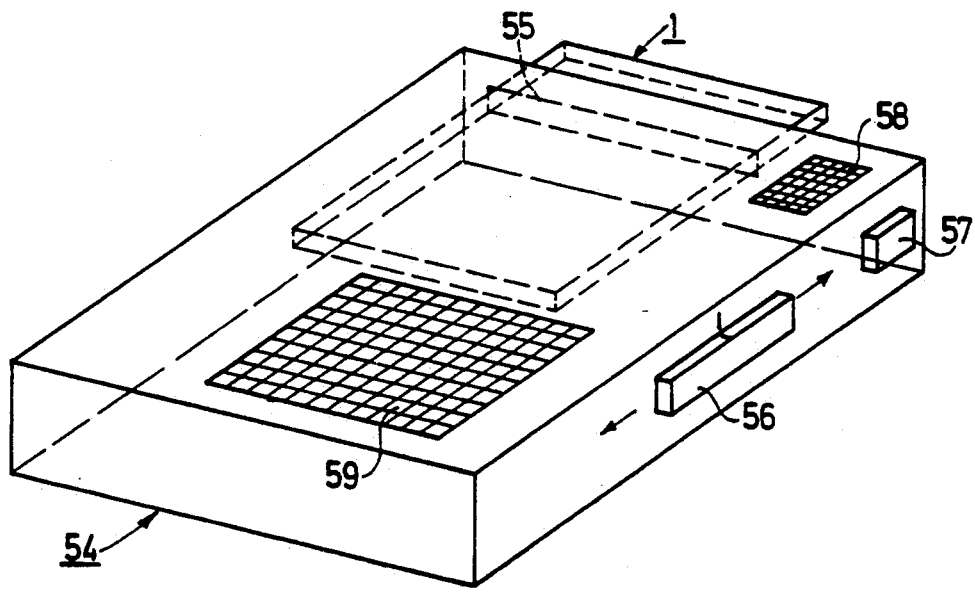
Fig.7

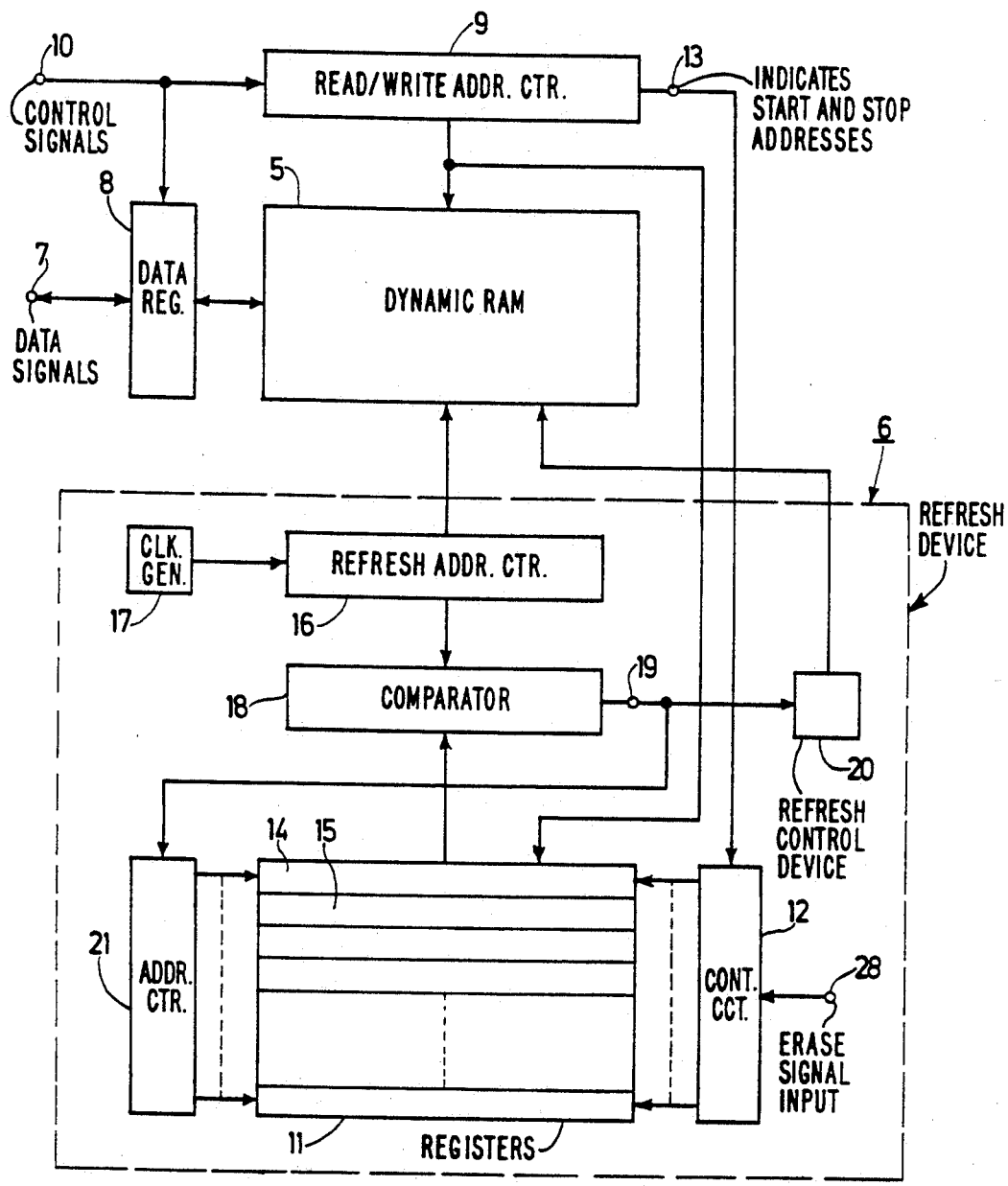
Fig.3
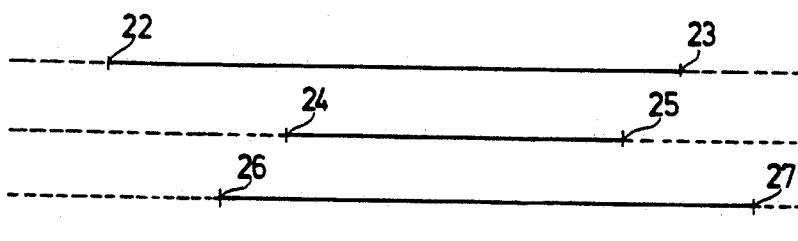
Fig.4a
Fig.4b
Fig.4c

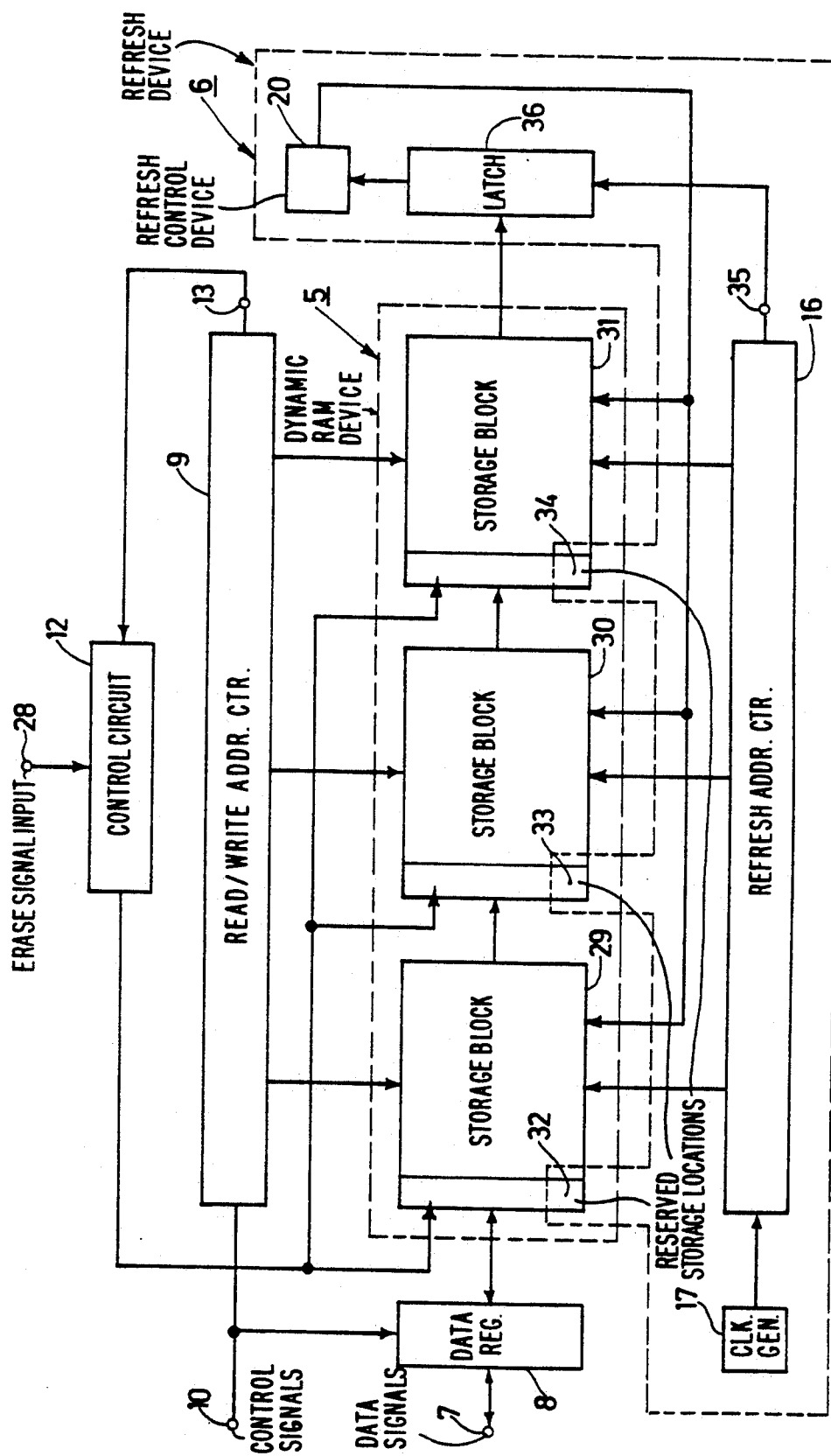

STORAGE MODULE INCLUDING A REFRESH DEVICE FOR STORING START AND STOP REFRESH ADDRESSES

This is a continuation of application Ser. No. 07/337,022, filed Apr. 12, 1989, now abandone.

BACKGROUND OF THE INVENTION

The invention relates to a storage module for interfacing with a data processing apparatus and which includes an at least partly random accessible storage device for storing digital data signals, an access device for serially accessing a series of storage locations in the storage device in order to write and read in these storage locations between a start address and a stop address, and a battery for powering the storage module when it is disconnected from the data processing apparatus. Various versions of such storage modules are known. For example, such a storage module may use an audio tape cassette. An alternative realization of such a storage module is in the form of a card, for example as a so-called chip card as described in EP-231 090. Storage modules of this kind store data signals for which it must be ensured that the storage contents are not lost when the storage module is not connected to the data processing apparatus. To achieve this, EEPROM (Electrically Erasable Programmable Read Only Memory) components are often used as a storage device for chip cards which must have a particularly flat construction. In fact, these components also retain their contents when the storage module does not receive a supply voltage; consequently, it is not necessary to include a battery in the storage module. Such EEPROM components, however, are comparatively expensive so that for many of such applications use is also made of static RAM (Random Access Memory) components which require a supply voltage in order to retain their contents but which have only a low current consumption so that the battery required in the storage module has a comparatively long service life. Even though such static RAM components are less expensive than EEPROM components, they are still comparatively expensive.

SUMMARY OF THE INVENTION

Among other things, the invention has for its object to construct a storage module that is simple and inexpensive and in which the battery used therein has a long service life. To achieve this, in accordance with one aspect of the invention, a storage device requiring refreshing, or simply "refresh", cooperates with a refresh device for refreshing data signals stored in the storage device, the refresh device including additional storage devices in which, upon writing in storage locations of the storage device, start and stop addresses (the term "addresses", as used herein, also includes indications of addresses, with the term "indications of addresses" referring to the identification of addresses of storage block locations which are at least partly filled with data, and thus need to be refreshed are stored, under the control of a control circuit, storage locations of the storage device which are situated between a pair of start and stop addresses being timely refreshed in dependence on start addresses and stop and under the control of a refresh control device, the storage locations of the storage device which are situated outside a pair of start and stop addresses being left unrefreshed. By using a storage device requiring refresh in accordance with this first aspect of the invention, it is achieved that the storage module can be simply and inexpensively manufactured, because such storage devices, notably dynamic RAM components requiring refresh are less expensive than static RAM components or EEPROM components. Storage devices requiring refresh, however, have the drawback that they require a comparatively large amount of power for refresh of their contents implying a comparatively short service life of the battery used in the storage module. Therefore, in accordance with a further aspect of the invention, among the storage locations of the storage device requiring refresh essentially only those locations in which data signals are stored are timely refreshed, the other storage locations not being timely refreshed. Thus, a substantial amount of energy which would be required for the refresh of the vacant storage locations is saved and the service life of the battery used in the storage module is substantially increased. Overall, the steps proposed in accordance with the invention thus ensure simple and inexpensive manufacture of the storage module, and at the same time a comparatively long service life is achieved for the battery used in the storage module.

It has been found that a storage device requiring refresh is preferably constructed as a dynamic RAM device. Such a dynamic RAM device is accessible at random, enabling refresh of exclusively the storage locations which are actually occupied.

It has also been found, however, that the storage device requiring refresh is advantageously composed of at least two storage blocks which are block-wise random accessible and which are formed by charge transfer memories. Such charge transfer memories can be very inexpensively obtained and require only comparatively little energy for refresh, so that the fact that they can be only block-wise refreshed is not detrimental. For example, for such a charge transfer memory use can be made of a so-called CCD component or Charge Coupled Device.

It has also been found that it is advantageous when the further storage devices for the storage of start and stop addresses are formed by a separate set of registers. The use of such separate registers for the storage of start and stop addresses results in comparatively simple data management, it also being ensured that any modifications required in the storage of the indications of start and stop addresses can be simply and reliably made.

When the storage device requiring refresh is constructed as a dynamic RAM device, it has also been found that the further storage devices for the storage of start and stop addresses advantageously consist of reserved storage locations of the dynamic RAM device whose contents are successively transferred to a latch which in its turn controls the refresh control device. As a result of the use of separate, reserved storage locations of the dynamic RAM device itself for the storage of start and stop addresses it is achieved that no separate storage devices are required for this purpose, resulting in a particularly simple construction.

In this respect it has also been found to be advantageous when the reserved storage locations are situated at predetermined, uniformly spaced addresses of the dynamic RAM device. Thus, simple data management is again obtained for the refresh of the storage locations of the dynamic RAM device, refresh taking place block-wise in corresponding blocks.

It has been found to be advantageous when the control circuit can receive, via a separate input, an erase signal for erasing indications of start and stop addresses stored in the further storage devices. Thus, simple erasure of data signals stored in the storage device is achieved, because erasure is realized simply by omitting the refresh of the relevant storage locations in the storage device.

Such a storage module can be advantageously constructed as a chip card. By using a storage device requiring refresh, the construction of the storage module in accordance with the invention which enables the use of a comparatively thin battery because the battery is used in an energy-saving manner so that it has a comparatively long service life. As has already been stated, storage modules constructed as chip cards are known per se, although they utilize other storage devices which are not constructed as storage devices requiring refresh.

The invention also relates to the use of a storage module in accordance with the invention in a special data processing apparatus. In accordance with the invention, the storage module is thus used in conjunction with a data processing apparatus which is constructed as a dictating apparatus, the data signals to be stored being speech signals which are converted into digital signals for storage in the storage module. Because a storage module constructed in accordance with the invention is also suitable for the storage of large amounts of data, it can thus be advantageously used as a readily exchangeable storage medium for dictating apparatus, in the same way as the known tape audio cassettes; however, its use results in a substantially simpler construction of the dictating apparatus because the apparatus no longer requires a comparatively complex mechanism for driving a record carrier by means of a motor in accordance with the various modes of operation of the apparatus.

BRIEF DESCRIPTION OF THE DRAWINGS

The invention will be described in detail hereinafter with reference to the drawing, in which:

FIG. 1 is a plan view and a partial sectional view of a storage module which is constructed as a chip card;

FIG. 2 shows the storage module of FIG. 1 in a side elevation;

FIG. 3 shows a block diagram of a first embodiment in which a dynamic RAM device is used as the storage device requiring refresh and in which a separate set of registers serves as the further storage devices for storing start and stop addresses;

FIGS. 4a, 4b and 4c show diagrams illustrating various possibilities for modifying data signals stored in the dynamic RAM device shown in FIG. 3;

FIG. 5 shows a block diagram of a second embodiment in which a dynamic RAM device is again used as the storage device requiring refresh; however, reserved storage locations of the dynamic RAM device itself are used as the further storage devices for the storage of start and stop addresses;

FIG. 7 illustrates use of a storage module in a dictating apparatus.

DESCRIPTION OF THE PREFERRED EMBODIMENTS

Figure 6:
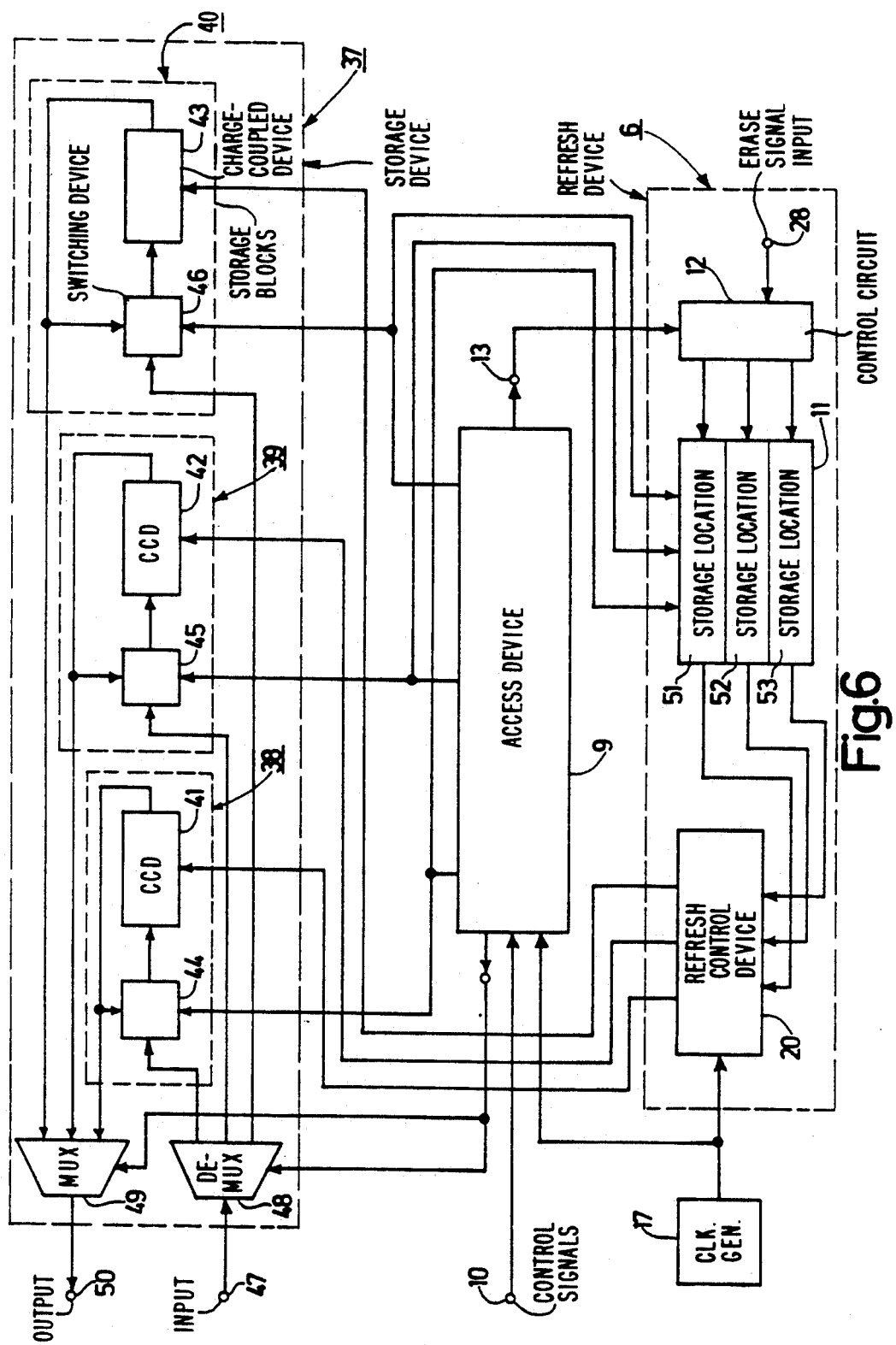
FIG. 6 shows a block diagram of a further embodiment in which the storage device requiring refresh includes three storage blocks which are formed by charge transfer memories.

The reference numeral 1 in the FIGS. 1 and 2 denotes a storage module which is constructed as a chip card. The chip card consists of a plastic part in which the electrical and electronic components of the storage module are embedded. Of these components FIG. 1 diagrammatically shows an at least partly randomly accessible storage device 2 and a battery 3. At an edge of the chip card there is provided a contact strip 4 whose contacs are connected to the circuit of the storage module and serve to establish electrical connections to a data processing apparatus in which the chip card can be introduced as a storage module. For the storage device 2 use is made of a storage device requiring refresh, because such storage devices are inexpensive so that the cost of manufacturing the chip card may be low. Such storage devices 2 requiring refresh may be, for example, dynamic RAM devices or charge transfer memories. When the chip card is not connected to the data processing apparatus, the battery 3 accommodated therein ensures that the data signals stored in the storage device 2 requiring refresh are sustained by means of a refresh device provided for this purpose. Such storage devices requiring refresh, however, have the drawback that they require a comparatively large amount of energy for refreshing the data signals stored in their storage locations in order to sustain these signals, notably when the chip card is not connected to the data processing apparatus. This has an adverse effect on the service life of the battery 3 used. In order to mitigate this drawback, special steps are taken which enable refresh of the storage device with a comparatively low energy consumption, as will be described in detail hereinafter for several embodiments.

For the block diagram of FIG. 3, it is assumed that the storage device which is included in the storage module and which requires refresh is formed by a dynamic RAM device 5 which cooperates with a refresh device 6. The digital data signals (referred to hereinafter simply as data) which are to be stored in the storage module are applied to a connection 7 of the storage module wherefrom they reach a data register 8 which cooperates with the dynamic RAM device 5. This data register 8 also serves to receive data stored in the dynamic RAM device 5, which data is subsequently provided on the connection 7. For serial access to the storage locations in the dynamic RAM device 5 for the reading or writing in these storage locations there is provided an access device 9 which receives, together with the data register 8, control signals from a connection 10 of the storage module. Such an access device 9 customarily consists of a read/write address counter. The data of individual data blocks are written in the storage locations of the dynamic RAM device 5 between start addresses and stop addresses which are defined by the access device 9. Thus, various data blocks are defined between a pair of a start address and a next-following stop address.

The refresh device 6 comprises additional storage devices which are in this case formed by a separate set of registers 11, in which start and stop from the access device are stored under the control of a control circuit 12, upon writing in the storage locations of the dynamic RAM device 5. The presence of a start address in the access device 9 is signalled to the control circuit 12 via an output 13 of the access device 9, which control circuit defines a storage location for the start address, which storage location is denoted by the reference numeral 14 in the set of registers 11; in this location this start address can be stored by the access device 9. When the subsequent storage of the data associated with a data block in the dynamic RAM device 5 is followed by a stop address by the access device 9, this fact is again signalled to the control circuit 12, via the output 13 of the access device 9, thus causing the control circuit to select the next storage location in the set of registers 11, which location is denoted by the reference numeral 15, in which the stop address is stored by the access device 9. This procedure is repeated for each data block to be stored in the dynamic RAM device 5, so that in the individual storage locations in the set of registers 11 a respective pair of start and stop addresses is successively stored. Thus, it is exactly defined in which storage locations of the dynamic RAM device 5 data is stored.

The refresh device 6 also comprises a further access device 16 for the dynamic RAM device 5, which further access device is controlled by a clock generator 17 and formed, for example by a refresh address counter. The further access device 16 also applies the address supplied to the dynamic RAM device 5 to a comparator 18 which is also included in the refresh device 6 and which compares this address with an address stored in the set of registers 11, the comparator always starting with the first start address stored. When the comparator 18 detects correspondence between the address supplied by the further access device 16 and the relevant address stored in the set of registers 11, an output 19 of the comparator 18 supplies a control signal which is applied to a refresh control device 20, ensuring that from the instant of detection of correspondence of the two addresses in the comparator 18 the subsequent storage locations in the dynamic RAM device 5 are refreshed. Such a control signal occurring on the output 19 of the comparator 18 is also applied to an address counter 21 which is associated with the set of registers 11 and which ensures that, in response to such a control signal, in the set of registers 11 the next storage location 15 is addressed (in which the stop address associated with the start address is stored), the stop address being applied to the comparator 18. As soon as the further access device 16 reaches the relevant stop address during its progression from one address to another, the comparator 18 again detects correspondence and its output 19 again supplies a control signal which is again applied to the refresh control device 20 which ensures that the refresh of the storage locations in the dynamic RAM device 5 is interrupted. This control signal on the output 19 of the comparator 18 is again applied to the address counter 21 which then selects the next storage location in the set of registers 11 to be coupled supplies to the comparator 18. In this storage location of the set of registers 11 there is stored, if applicable, the next start address of a further data block, which means that the refresh of the storage locations in the dynamic RAM device remains interrupted until this address is reached by the further access device 16, the refresh subsequently being resumed until the next stop address is reached.

As is shown, it is thus achieved that only the storage locations of the dynamic RAM device 5 which are situated between a pair of start and stop addresses are timely refreshed, the storage locations of the dynamic RAM device 5 which are situated outside a pair of the start and stop addresses not being refreshed. This means, however, that in practice the number of storage locations of the dynamic RAM device 5 which must be refreshed is substantially reduced, because in customary operating conditions the full storage capacity of the dynamic RAM device 5 is only rarely used or necessary. Consequently, the power required for refreshing the dynamic RAM device is also reduced, so that the service life of the battery powering the storage module is increased. It has been found that the service life of the battery can thus be substantially prolonged.

For the organization of the start and stop addresses, there are a number of alternatives as will be described with reference to the FIGS. 4a, b and c. The reference numeral 22 in FIG. 4a denotes a start address and the reference numeral 23 denotes a stop address of a data block, it being assumed that the intermediate storage locations of the dynamic RAM device 5 are fully utilized for storing this data block. Such a data block can be adjoined, for example directly by a further block which is not shown herein. It is also assumed that a new data block, as indicated in FIG. 4b, is to be stored in the data block stored between the start address 22 and the stop address 23, the new data block being shorter than the previously stored data block. This new data block should be defined, for example by the start address 24 and the stop address 25. Steps may be taken so that the start address 22 in the set of registers 11 is erased and replaced by the new start address 24. Similarly, the stop address 23 can be erased and replaced by the new stop address 25. Thus, only the storage locations of the dynamic RAM device 5 which are situated between the new start address 24 and the new stop address 25 will be refreshed, the storage locations of the dynamic RAM device which are situated between the start addresses 22 and 24 and the stop addresses 25 and 23 being automatically erased because they are no longer refreshed. However, it would alternatively be possible, after detection that the the new addresses 24 and 25 are situated within the range of the original addresses 22 and 23, that for this case the original start address 22 and the original stop address 23 are retained for the refresh of the intermediate storage locations of the dynamic RAM device 5, the storage locations of the dynamic RAM device 5 which are situated between the original start address 22 and the original stop address 23 being filled with the new data. The situation is different in the example shown in FIG. 4c where the data block defined by a start address 26 and a stop address 27 extends beyond the data block defined by the original stop address 23. This case necessitates deliberate erasure of the original stop address 23 which is to be replaced by the new stop address 27. As regards the new start address 26 the same holds true as in the case described with reference to FIG. 4b, because this new start address 26 is again situated within the range of the addresses 22 and 23. As is shown, therefore, for the management of the set of registers 11 it is advantageous to provide an address sorting mechanism. Another possibility consists in that the refresh of the storage locations in the dynamic RAM device 5 is performed in blocks. In such a case, for example only the more-significant bits of the addresses to be compared in the comparator 18 could be taken into account for such a comparison.

An address stored in the set of registers 11 can be erased in that an erase signal is applied to the control circuit 12 via a separate input 28. The erasure of a pair of start and stop addresses, however, also enables erasure of the entire data block situated therebetween in the storage locations of the dynamic RAM device 5, because the erasure of these start and stop addresses at the same time inhibits the refresh of the intermediate storage locations in the dynamic RAM device 5, thus making separate erasure of the relevant storage locations of the dynamic RAM device superfluous.

The block diagram of FIG. 5 represents a dynamic RAM device 5 which consists of a plurality of storage blocks, i.e. three storage blocks which are denoted by the reference numerals 29, 30 and 31 in the present embodiment. Each of these storage blocks may be formed by a separate component or a dynamic RAM device may be internally subdivided into such storage blocks. The data to be stored is again applied to a connection 7 of the storage module and further to a data register 8 which cooperates with the dynamic RAM device 5. For serially accessing the storage locations of the dynamic RAM device 5 there is again provided an access device 9 which receives, together with the data register 8, control signals from a connection 10 of the storage module.

In the present embodiment the refresh device 6 includes additional storage devices for storing the indications of start and stop addresses, being reserved storage locations of the dynamic random device 5 itself. These reserved storage locations are denoted by the reference numerals 32, 33 and 34 in FIG. 5, one of these reserved storage locations being assigned to one of the storage blocks 29, 30 and 31 of the dynamic RAM device 5. In the present case the reserved storage locations are situated at predetermined, uniformly spaced addresses of the dynamic RAM device 5. However, it would also be possible to situate these reserved storage locations at arbitrary addresses of the dynamic RAM device. Upon writing in the storage locations of the respective storage blocks 29, 30 and 31 of the dynamic RAM device 5, start addresses are stored, in reserved storage locations 32, 33 and 34, by the relevant access device 9, again under the control of a control circuit 12, as soon as data is stored in at least some of the storage locations of the storage block 29, 30 or 31 of the dynamic RAM device 5 associated with the reserved storage location. Thus, for a given storage block of the dynamic RAM device the reserved storage location of the subsequent storage block of the dynamic RAM device at the same time forms the stop address for the preceding storage block of the dynamic RAM device. The start addresses can be very simply realized in that it is merely necessary to memorize whether the storage locations of the relevant storage block of the dynamic RAM device are used in the data storage or not. When the access device 9 defines such a start address for a storage block of the dynamic RAM device, it is suitably signalled to the control circuit 12 via the output 13 of the access device 9, which control circuit then stores the indication in the relevant reserved storage location of the associated storage block of the dynamic RAM device.

The refresh device 6 includes a further access device 16 for the dynamic RAM device 5, which further access device is controlled by a clock generator 17, an output 35 of the further access device controlling a latch 36 which itself controls the refresh control device 20 for the dynamic RAM device 5. As soon as the further access device 16 defines an address which corresponds to one of the reserved storage locations 32, 33 or 34 of one of the storage blocks 29, 30 or 31, its output 35 supplies a control signal to the latch 36 so that the contents of this reserved storage location are transferred to the latch 36. When this reserved storage location contains an indication that the relevant storage block of the dynamic RAM device is at least partly filled with data, the indication transferred to the latch 36 ensures, under the control of the refresh control device 20, that the subsequent storage locations in the relevant storage block of the dynamic RAM device 5 are refreshed. Refresh is continued until the further access device 16 encounters the next reserved storage location whose contents are transferred to the latch 36. When the next reserved storage location contains a signal indicating that this storage block of the dynamic RAM device is also filled with data, the storage locations of this storage block of the dynamic RAM device are refreshed again via the refresh control device 20. This procedure continues until the further access device 16 encounters a reserved storage location which contains an indication that no data is stored in the relevant storage block of the dynamic RAM device. The transfer of this indication to the latch 36 ensures that, in response thereto, the refresh control device 20 interrupts the refresh of the further storage locations of this storage block of the dynamic RAM device. Such an interruption of the refresh lasts until the further access device 16 again encounters a reserved storage location containing an indication that data is stored in the storage locations of the relevant storage block of the dynamic RAM device.

As is shown, in the present example the refresh of the storage locations of the dynamic RAM device is performed block-wise, depending on whether or not data is stored in the relevant storage block. The signal contained in the reserved storage location of a storage block thus simply forms the start address for this storage block as well as the stop address for the preceding storage block of the dynamic RAM device, resulting in a particularly simple data management. If desirable, of course, each end of a storage block of the dynamic RAM device could also be formed by a separate indication in a reserved storage location.

Thus, in the present embodiment power is again saved in the refreshment of the storage locations of the dynamic RAM device, because only the storage blocks of the dynamic RAM device in which data is stored are refreshed.

In the block diagram shown in FIG. 6 the storage device requiring refresh is denoted by the reference numeral 37, the storage device consisting, for example, of three storage blocks 38, 39 and 40 which can be block-wise addressed at random and which are in this case formed by charge transfer memories 41, 42 and 43. For the charge transfer memories use can be made of, for example, CCD components which are also referred to as Charge Coupled Devices. In charge transfer memories of this kind the data stored is refreshed in that, under the control of a clock generator 17 and an access device 9, the data appearing on the output of the charge transfer memory is applied to the input of the charge transfer memory; this is realized by means of switching devices 44, 45 and 46. For the storage of a data signal, data is applied from an input 47 of the storage device to a demultiplexer 48 which block-wise applies the data to the individual storage blocks 38, 39 and 40. The data stored in the storage device 37 is interrogated in a similar way by means of a multiplexer 49 which recombines the data stored in the individual storage blocks so as to form a data signal which becomes available on an output 50 of the storage device 37. These procedures are again controlled by the access device 9 which receives appropriate control signals via an input 10.

Refresh of the data in the storage device 37 is again performed by means of a refresh device 6. The further storage devices provided in the refresh device 6 are formed by a set of registers 11 which in this case includes three storage locations 51, 52 and 53, corresponding to the three storage blocks 38, 39 and 40 of the storage device 37. These three storage locations are again selected by means of a control circuit 12 which receives control signals from an output 13 of the access device 9, which control signals indicate in which of the three storage blocks 38, 39 and 40 of the storage device 37 data is stored, appropriate signals being stored in the storage locations 51, 52 and 53 under the control of the access device 9. These stored signals relate to a start address as soon as one of the data blocks 38, 39 and 40 contains data. As has already been stated, the data stored in a storage block is refreshed in that the data is continuously derived from and returned to the charge transfer memory. In the present case a start address of the data stored in the storage block again forms at the same time the associated stop address, because the data in the data block is conducted in a loop. The indications stored in the storage locations 51, 52 and 53 of the set of registers 11 thus indicate whether data to be refreshed is stored in the associated storage block. In dependence of these stored indications, the data stored in the storage blocks 38, 39 and 40 is thus refreshed via the refresh control device 20, only the storage blocks in which data is stored being refreshed. A power-saving refresh operation is thus performed again for all data stored in the storage device 37.

The described storage modules are also suitable for the storage of large quantities of data, the battery contained in each storage module ensuring, because of the power saving operation of the storage module, that the storage contents are saved for a prolonged period of time and that the storage module also remains operational for a prolonged period of time. Because storage modules of this kind can also be readily exchanged, they are suitable for use in a data processing apparatus constructed as a dictating apparatus where the data signals to be stored are speech signals which are converted into digital signals for storage in the storage module. This offers the advantage that the dictating apparatus utilizing such a storage module does not require a complex mechanical system, because its operation does not necessitate the use of a motor for driving the various components in accordance with the mode of operation of the apparatus such as in the case, for example in a dictating apparatus utilizing an audio tape cassette.

Such a dictating apparatus utilizing a storage module is shown in FIG. 7 in which the apparatus is constructed as a hand-held apparatus. The rectangular apparatus is denoted by the reference numeral 54 and includes a slit 55 at a narrow side in which a storage module 1 as described above can be inserted, its row of contacts then engaging a corresponding contact device in the apparatus, thus establishing electrical connections between the storage module and the apparatus. The traversing of the storage locations of the storage device included in the storage module can be activated in the forward and the reverse direction by means of a slide switch 56 which is included in the apparatus and which can be displaced in two opposite directions from a stop position. A further switch 57 enables selection between accessing (reading) of data stored in the storage locations of the storage device and the storage (writing) of data in the storage locations of the storage device, depending on whether reproduction or recording of a speech signal is concerned. Acoustic speech signals to be stored are applied to a microphone which is arranged in the apparatus and which is reached via a microphone entrance aperture 58 provided in the housing of the apparatus, which microphone converts the acoustic signals into analog electrical signals which in turn are converted into digital signals which are ultimately stored as data in the storage module 1. Data extracted from the storage module 1 are again converted into analog electrical signals which are reproduced as acoustic signals by a loudspeaker in the apparatus, via a sound exit aperture 59 provided in the housing of the apparatus. A storage module thus filled with speech in a hand-held dictating apparatus can be removed from the apparatus, for example for insertion into a stationary, desk-top dictating apparatus for evaluation of the speech signals stored in and reproduced by the storage module.

As appears from the foregoing, many alternatives can be realized for the described embodiments of a storage module in accordance with the invention without departing from the scope of the invention. These alternatives concern the construction and organization of the storage device requiring refresh which is used in the storage module as well as the associated data management in view of the refresh of only the data stored between given start addresses and stop addresses in the storage device.

I claim:

1. A storage module for use with data processing apparatus and which comprises an at least partly randomly accessible storage device for storing digital data signals, an access device for serially accessing a series of storage locations in the storage device in order to write to, and read data from these storage locations between a start address and a stop address, and a battery for powering the storage module when it is disconnected from the data processing apparatus, characterized in that the storage device is constructed as a storage device requiring refresh which cooperates with a refresh device for refreshing data signals stored in the storage device, the refresh device comprising additional storage devices in which, upon writing in storage locations of the storage device, start and stop addresses from the access device are stored, under the control of a control circuit, storage locations of the storage device which are situated between a pair of start and stop addresses being timely refreshed under the control of a refresh control device, storage locations of the storage device which are situated outside a pair of start and stop addresses not being refreshed.

2. A storage module as claimed in claim 1, characterized in that the storage device requiring refresh comprises at least two storage blocks, said blocks being formed by charge transfer memories and being randomly accessible.

3. A storage module as claimed in claim 1, characterized in that the additional storage devices for the storage of the start and stop addresses are formed by a set of registers.

4. A storage module as claimed in claim 1, characterized in that the control circuit can receive, via a separate input, an erase signal for erasing start and stop addresses stored in the additional storage devices.

5. A storage module as claimed in claim 1, characterized in that the storage module is a chip card.

6. A storage module as claimed in claim 1, characterized in that the storage device requiring refresh is formed by a dynamic random access memory (RAM) device.

7. A storage module as claimed in claim 6, characterized in that the additional storage devices for the storage of the start and stop addresses consist of reserved storage locations of the dynamic RAM device whose contents are successively transferred to a latch which controls the refresh control device.

8. A storage module as claimed in claim 7, characterized in that the reserved storage locations are situated at predetermined, uniformly spaced addresses of the dynamic RAM device.

* * * * *